United States Patent [19]

Carlton

[11] 4,201,274

[45] May 6, 1980

[54] SYMMETRICAL SPEAKER HAVING STRUCTURAL REINFORCING PORTS

[76] Inventor: Christopher F. Carlton, 16001 SW. 102 Ave., Miami, Fla. 33157

[21] Appl. No.: 962,562

[22] Filed: Nov. 20, 1978

[51] Int. Cl.[2] .............................................. H05K 5/00

[52] U.S. Cl. ...................................... 181/156; 181/199

[58] Field of Search ................ 181/156, 148, 153, 199

[56] References Cited

U.S. PATENT DOCUMENTS

| | | | |
|---|---|---|---|
| 1,875,171 | 8/1932 | Sprague et al. | 181/156 |
| 2,167,625 | 8/1939 | Albano | 181/156 |
| 2,890,297 | 6/1959 | Lehr | 181/148 |
| 3,746,125 | 7/1973 | Hammes | 181/199 |
| 4,082,159 | 4/1978 | Petty | 181/156 |

FOREIGN PATENT DOCUMENTS

| | | | |
|---|---|---|---|
| 23345 | 8/1936 | Australia | 181/156 |
| 104979 | 8/1938 | Australia | 181/156 |

*Primary Examiner*—L. T. Hix
*Assistant Examiner*—Benjamin R. Fuller
*Attorney, Agent, or Firm*—Jack E. Dominik

[57] ABSTRACT

A cubicle enclosure body for mounting a speaker having a plurality of reflex ports peripherally disposed on one face thereof outwardly of a centrally disposed circular aperture. A speaker element is in registry with the circular aperture. The combined cross-sectional area of the ports is approximately one-fifth (1/5) of the cross-sectional area of the speaker element. A first pair of ports lie diametrically opposed to each other on a vertical plane bisecting the enclosure body, and a second pair of ports lie diametrically opposed to each other on a horizontal plane bisecting the enclosure body. Each port extends inwardly of the housing, thereby coacting with reinforcing members to serve the structural purpose of making the housing rigid and immutable to vibration.

6 Claims, 4 Drawing Figures

SYMMETRICAL SPEAKER HAVING STRUCTURAL REINFORCING PORTS

FIELD OF THE INVENTION

1. Background of the Invention

This invention relates generally to enclosure bodies for housing speakers, more particularly to such bodies having reflex ports formed therein, and specifically is directed to an enclosure body having uniform width, height and length dimensions and a balanced distribution of ports, thereby effecting sound reinforcement by symmetry of construction.

2. Description of the Prior Art

Enclosure bodies for speakers have been built in the very recent past wherein multi-directional sound characteristics were sought to be achieved by the construction of irregularly shaped speaker housings. Exemplary of such efforts is the speaker disclosed in U.S. Pat. No. 4,073,365 to Johnson (1978).

Early attempts at lowering the resonant frequency of speakers enclosed in housings resulted in constructions as disclosed in U.S. Pat. No. 1,760,862 to Weinberger et al (1930), wherein the long wave, low frequency, standing waves generated by bass notes were sought to be eliminated by reducing the air space rearwardly of the vibratile diaphragm, thereby inhibiting the motion of the air in said space.

Speaker housings have been disclosed wherein the ratio between the volume of the air space rearwardly of the vibratile diaphragm to the volume of the air in the reflex ports have been varied to lower the effective resonance of the speaker. A discourse of the mathematics involved in such a Helmholtz resonator is found in U.S. Pat. No. 2,694,462 to Robbins et al (1954). This approach results in the construction of a speaker in which a major portion of the vibratile diaphragm is not in communication with the ambient air.

Other speakers have been disclosed, however, that rely not on the principle of the Helmholtz resonator, but instead on the coaction of a port with a barrier in spaced-apart relationship to the port. An example of this type of device is disclosed in U.S. Pat. No. 3,815,707 to Burhoe (1974).

The concepts of symmetry and harmony in speaker housing construction does not appear in the prior art. Most of the prior art devices are elongate rectangles in shape. The sound waves appearing interiorly of the housing, therefore, are not presented with a uniform reflecting environment. The hodge-podge dimensions of these prior art devices result in distortion of the sound as perceived by the human ear. The reflex ports that appear in the prior art are not symmetrically mounted. They have even appeared in corners, where sound turbulence is increased. Attempts to build Helmholtz resonator-type speaker housings have produced difficult to construct cabinets, complete with false bottoms to form ducts and orifices which block sound from emanating from a major portion of the vibratile diaphragm.

These limitations of the prior art devices are overcome by the structure now disclosed, which is easy to manufacture, pleasing in appearance, and which reproduces musical signals from 20 to 800 hertz with utmost clarity.

SUMMARY OF THE INVENTION

Six panels having like dimensions are assembled into a cube in three dimensional space.

One of the panels is selected to have formed centrally therein a circular aperture. The vibratile diaphragm of a speaker element is peripherally mounted in registry with the aperture to allow the broadcast of sound therefrom, in the conventional manner.

Four reflex ports are formed on the apertured panel, two of said ports lying on a horizontal plane bisecting said housing and the other two ports lying on a vertical plane bisecting said housing.

The ports are thus symmetrically disposed on the face of the housing, in spaced-apart, equidistant relationship with each other. Each lies at a maximum distance from a corner of the housing, and at a maximum distance from the vibratile diaphragm-receiving aperture.

It is thus seen to be an object of the invention to provide for reproduction of musical signals in the 20–800 hertz range by harnessing the symmetry of a cubicle enclosure.

Another related object is to reproduce such signals in a device where the entire vibratile diaphragm of the speaker is in communication with the ambient air.

Another object is to provide a speaker having no orifice connecting a reflex port with the vibratile diaphragm.

Still another object is to provide a speaker having ports which need not rely on coaction with a barrier means, thereby providing a speaker having self-sufficient ports.

It is another object to provide a speaker having rigid, reinforced walls by providing ports having the dual function of providing compression release and of structurally reinforcing the panels of the speaker housing.

It is a further object to provide a speaker housing constructed of three-quarter inch plywood which is nevertheless immutable to vibration by reason of structural reinforcement members coacting with the said reflex ports.

These and other objects of the invention will become readily apparent as this description proceeds, and by reference to the appended drawings.

BRIEF DESCRIPTION OF THE DRAWINGS

Further objects and advantages of the present invention will become apparent as the following description proceeds, taken in conjunction with the accompanying drawings in which.

DESCRIPTION OF THE PREFERRED EMBODIMENT

Figure 1:
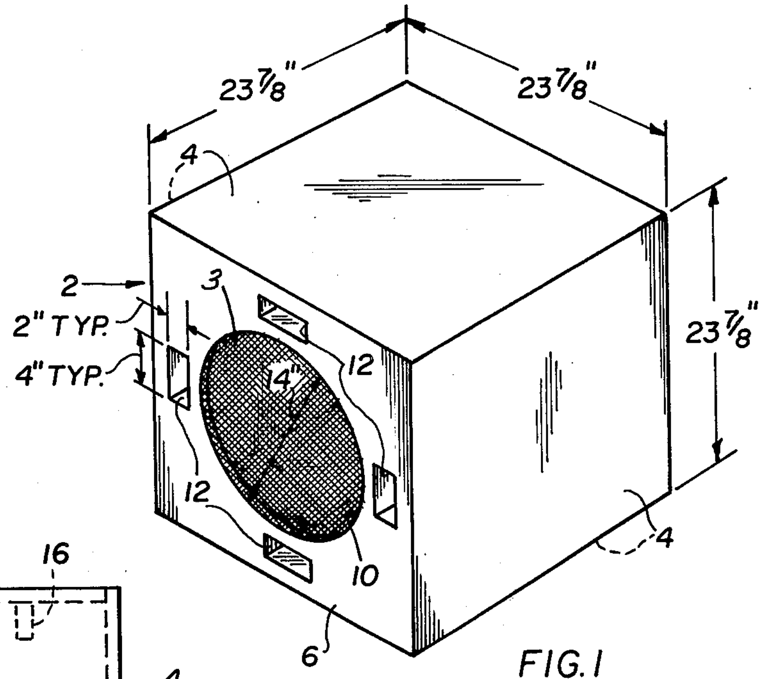
FIG. 1 is a perspective view of the preferred embodiment.
Figure 2:
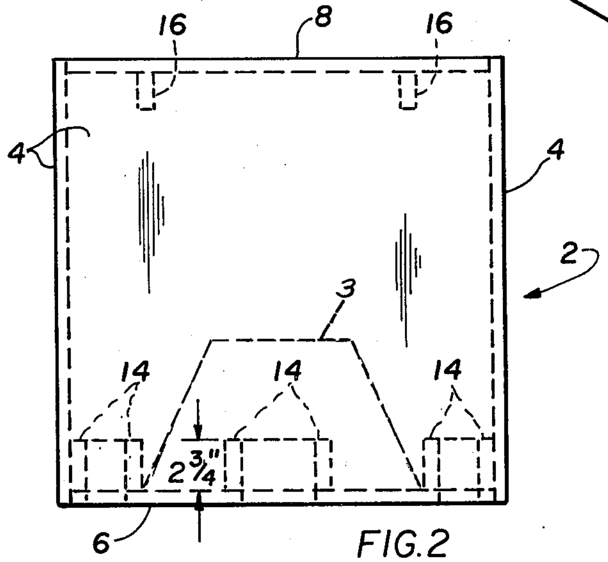
FIG. 2 is an elevational view of the preferred embodiment.
Figure 3:
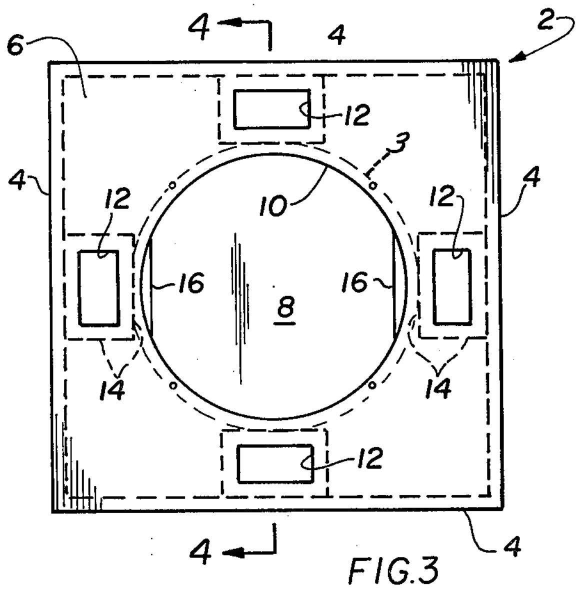
FIG. 3 is a front plan view of the preferred embodiment.
Figure 4:
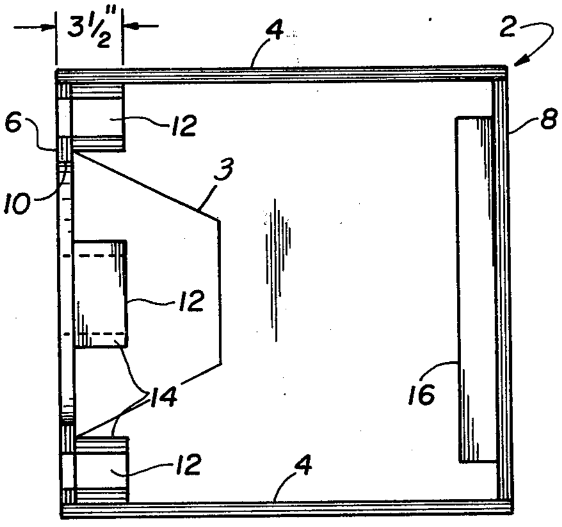
FIG. 4 is a side plan view of the preferred embodiment.

Referring now to the drawings, in which like reference numerals refer to like parts, a cubicle speaker housing, generally designated 2 is provided for speaker 3. The cubicle is constructed of four side walls 4, a front panel 6, and a rear panel 8. In a preferred embodiment, each wall or panel is constructed of three-quarter inch plywood. The materials thus needed to construct this embodiment are therefore readily available and economical.

Each of the walls or panels is of like dimension. In a preferred embodiment, the depth, height and width of the cubicle enclosure is 23⅝ inches. A circular aperture 10 is formed on the front panel for receiving a vibratile diaphragm in peripherally-mounted relationship therein. In a preferred embodiment, this aperture is 14 inches in diameter, and therefore has a cross-sectional area of approximately 154 square inches.

The volume of the cavity defined by the speaker walls is approximately 8 cubic feet. Accordingly, if reinforce-members are not provided, the walls of the speaker will vibrate when low frequency waves appear therein.

Furthermore, if a plurality of reflex ports are not provided, the lower frequencies of musical signals as reproduced by the vibratile diaphragm will be lost entirely.

The twin problem of structural vibration of the speaker housing and the need for reflex ports is solved by a construction in which reflex ports serve not only the resonance-lowering function of the prior art speakers, but also the function of structural reinforcement.

Reflex ports 12 are therefore formed on the front panel 6 with peripherally-mounted walls 14 extending inwardly therefrom. The peripheral walls 14, which in a preferred embodiment extend inwardly a distance of 2¾ inches (making the total port depth 3½ inches) thus provide structural reinforcement to the housing. Each port is fixedly secured to an associated side wall 4 along its length in addition to being fixedly secured to the front panel 6. In this manner, the right-angle relationship of the front panel 6 to each of the four side walls 4 is substantially maintained even when very low frequency notes are reproduced by the speaker (not shown).

To complete the structural reinforcement, a pair of longitudinal ribs, or strengthening members 16 is provided. The ribs 16 are fixedly secured in vertical disposition to the rear panel 8 in transversely spaced apart substantially parallel relationship to each other, and thus inhibit vibration of the rear panel 8.

Since each of the six panels are fixedly secured to adjoining panels, a single cohesive unit is thereby formed, wherein the peripherally-mounted walls 14 and the longitudinal ribs 16 coact to provide a structurally reinforced cabinet.

The total volume of air in the ports of the preferred embodiment is approximately 112 cubic inches (2 inches×4 inches×3.5 inches). The total cross-sectional area of the ports as illustrated is 32 square inches. Thus, the total cross-sectional area of the ports is roughly 1/5 of the cross-sectional area of the circular aperture. The ports thus serve to lower the resonant frequency of the speaker so that a frequency range of 20–800 hertz can be reproduced without appreciable distortion.

The ports 12 are preferably disposed on the front panel in sites selected to conform with several criteria. It is important to provide for a symmetrical configuration of ports, to achieve a balanced sound. Therefore, in a preferred embodiment, a total of four ports were employed, each spaced 90 degrees from an adjacent port. The major axis of each port therefore lies on the circumference of an imaginary circle concentric with the circular aperture 10. The radius of the imaginary circle is maximized to the extent possible within the confines of the particular cubicle structure employed. In this manner, the ports are disposed a maximum distance from the periphery of the circular aperture. This optimal spacing enhances the resonance-lowering effect of the ports.

The mid-plane of one pair of ports lies on the vertical axis bisecting the speaker housing. Thus, these two ports are diametrically opposed to each other. The midplane of the remaining set of ports lies on the horizontal axis which bisects the speaker housing. These two ports are also diametrically opposed to each other. Thus, the four ports 12 are radially disposed upon the front panel in equidistant spaced-apart relationship.

The midpoint of each port lies at the midpoint of its associated front panel edge. Each port is thus disposed at a maximal, optimal distance from the corner areas of the cubicle housing, thereby minimizing the effects of turbulence existing near the corner regions of the housing interior.

Forming the ports 12 on the front panel 6 at an optimal, maximal distance from the circular aperture 10 and the corners of the cube serves the structural reinforcement purpose of the ports as well. If the peripherally mounted walls 14 of the ports 12 were disposed in configurations other than the disclosed disposition, the strengthening feature of the walls 14 would be lessened.

It can now be understood that four basic parameters must be met in the construction of this speaker housing. The housing must be cubicle; its ports must be disposed at a maximum distance from the vibratile diaphragm-receiving aperture; the ports must be disposed at a maximal distance from the interior corners of the cubicle; and the peripherally-mounted walls individual to each port must be placed to provide maximum structural leverage.

Although particular embodiments of the invention have been shown and described in full here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

What is claimed is:

1. An enclosure body for housing a speaker, comprising,

—a cubicle hollow housing having six panels,
—said housing having uniform dimensions,
—one of said panels having a centrally disposed aperture formed therein,
—a speaker mounted within said enclosure body so that its vibratile diaphragm is in registration with said aperture,
—a plurality of rectangular ports having a major dimension and a minor dimension formed in said apertured panel in equi-distant, radial relationship,
—said major dimensions of said rectangular ports lying along the outer periphery of the apertured panel so that the ends of center axes along such major dimensions lie in an imaginery circle concentric with the circular aperture.

2. In the speaker enclosure of claim 1, wherein two pairs of rectangular ports are formed in said apertured panel, a first pair lying in a horizontal plane bisecting the housing, in diametrically opposed relationship to each other, and a second pair of ports lying in a vertical plane bisecting the housing, in diametrically opposed relationship to each other, so that —the ports are symmetrically formed on the face of the apertured panel at a maximum distance from the interior corners of the housing, thereby avoiding distortion caused by the turbulance existing in the corner regions of the housing.

3. In the speaker enclosure of claim 1, wherein the radius of the imaginary circle is maximized, so that the rectangular ports are formed a maximum distance from the speaker-receiving circular aperture, thereby maximizing the distance that sound waves emanating rearwardly from said speaker must travel to escape the ports.

4. In the speaker enclosure of claim 1,

—said ports having peripherally mounted walls,

—said walls fixedly secured to a side panel and to the apertured panel for increasing the volume of air in the ports, and for providing structural reinforcement to the speaker housing.

5. In the speaker enclosure of claim 1, wherein the panel opposed to the apertured panel is provided with at least two longitudinal ribs in spaced-apart, substantially parallel vertical disposition, —whereby said ribs coact with the port periphery walls, thereby providing structural reinforcement to the speaker housing.

6. In the speaker housing of claim 1, wherein the total cross-sectional area of the ports is approximately one-fifth of the cross-sectional area of the speaker received within the circular aperture, —whereby frequencies in the 20–800 hertz range are reproduced without appreciable distortion.

* * * * *